(12) United States Patent
Bendak et al.

(10) Patent No.: US 6,715,113 B1
(45) Date of Patent: Mar. 30, 2004

(54) FEEDBACK SYSTEM AND METHOD FOR OPTIMIZING THE RECEPTION OF MULTIDIMENSIONAL DIGITAL FRAME STRUCTURE COMMUNICATIONS

(75) Inventors: George Beshara Bendak, San Diego, CA (US); Alan Michael Sorgi, San Diego, CA (US); Daniel M. Castagnozzi, Lexington, MA (US)

(73) Assignee: Applied Micro Circuits Corporation, San Diego, CA (US)

( * ) Notice: Subject to any disclaimer, the term of this patent is extended or adjusted under 35 U.S.C. 154(b) by 509 days.

(21) Appl. No.: 09/745,764

(22) Filed: Dec. 22, 2000

(51) Int. Cl.[7] .............................................. H03M 13/37
(52) U.S. Cl. ...................................................... 714/708
(58) Field of Search ......................................... 714/708

(56) References Cited

U.S. PATENT DOCUMENTS

| | | | |
|---|---|---|---|
| 5,251,205 A | 10/1993 | Callon et al. | |
| 5,359,607 A | * 10/1994 | Nguyen et al. | 714/708 |
| 5,490,149 A | * 2/1996 | Nylander-Hill | 714/5 |
| 5,490,252 A | 2/1996 | Macera et al. | |
| 5,568,471 A | 10/1996 | Hershey et al. | |
| 5,661,763 A | 8/1997 | Sands | |
| 5,666,108 A | 9/1997 | Duffy | |
| 5,778,000 A | 7/1998 | Dosiere et al. | |
| 5,793,976 A | 8/1998 | Chen et al. | |
| 5,854,699 A | 12/1998 | Olshansky | |
| 5,875,396 A | 2/1999 | Stockton et al. | |
| 5,982,743 A | 11/1999 | Kusano | |
| 6,006,069 A | 12/1999 | Langston | |
| 6,148,423 A | * 11/2000 | Le Mouel et al. | 714/708 |
| 6,490,007 B1 | * 12/2002 | Bouillet et al. | 348/614 |
| 6,513,136 B1 | * 1/2003 | Barker | 714/704 |
| 6,557,126 B1 | * 4/2003 | Kelly | 714/708 |
| 6,577,696 B1 | * 6/2003 | Burgmeier et al. | 375/376 |

* cited by examiner

*Primary Examiner*—Stephen M. Baker
(74) *Attorney, Agent, or Firm*—Incaplaw; Terrance A. Meador (57) ABSTRACT

A system and method are provided for using an analysis of forward error corrections (FEC) in a digital communications signal as feedback information to improve the performance of an analog receiver system. The FEC decoder supplies the number of "1" bit and "0" bit corrections made to a control unit. In response to the FEC corrections, the control unit changes receiver control parameters. The control signal modifies processing in the receiver front end to achieve the fewest number of FEC corrections.

16 Claims, 6 Drawing Sheets

FEEDBACK SYSTEM AND METHOD FOR OPTIMIZING THE RECEPTION OF MULTIDIMENSIONAL DIGITAL FRAME STRUCTURE COMMUNICATIONS

BACKGROUND OF THE INVENTION

1. Field of the Invention

This invention is generally related to digital communication systems and, more particularly, to a system and method for using error correction information to adjust receiver parameters in the improvement of information throughput.

2. Description of the Related Art

Digital signals are typically processed as a serial data stream and recovered using amplitude and timing parameters. Alternately stated, the amplitude of the digital signal must be monitored to detect the difference between a "1" bit and a "0" bit. In addition, a clock must be generated to differentiate bit positions.

In transmission, a signal can undergo several stages of amplification, attenuation, and limiting. Further, the transmission medium may act to degrade the signal. To recover the signal at a receiver, the signal voltage swing is analyzed around a threshold voltage. Signals above the threshold can be considered a "1" bit, while signals below the threshold can be considered a "0" bit. If the threshold is set correctly, no bits are misinterpreted in the threshold analysis. However, if the threshold is set incorrectly, then errors will result as the signal is converted into digital information. It is well known to control amplifier gain, loop gain, bandwidth, or receiver sensitivity in response to predetermined analog thresholds for improved performance. However, these analog system adjustments are not directly responsive to errors in converting the signal to digital information. That is, most systems attempt to simply adjust the aggregate power of the signal to a fixed level regardless of whether the majority of the power is noise.

Some forms of digital communications include forward error correction (FEC) information included as overhead. Using the FEC information, degraded or misinterpreted bits can be recovered. However, there is no standard practice for adjusting a receiver's gain based on the number of corrected bit errors in a FEC encoded channel.

It would be advantageous if digital processing information could be used to improve the performance of an analog receiver.

It would be advantageous if the FEC correction information from a digital signal could be used for optimizing receiver parameters, such as gain, sensitivity, bandwidth, or bandwidth response.

It would be advantageous if the corrections performed in the FEC process could be applied in an analog receiver feedback circuit to minimize the number of corrections required.

SUMMARY OF THE INVENTION

Accordingly, this invention provides a process for adjusting the signal strength of an incoming FEC coded signal based on the decoded bit error rate. An FEC device is described with programmable features that enable a feedback network to optimize receiver performance by counting the difference between the number of "1 to 0" errors and "0 to 1" errors. The FEC feedback receiver performs as follows:

adjusting the receiver gain or thresholding based on decoded bit error rate;

providing a programmable loop response (bandwidth control); and providing invertable error balance polarity.

The invention relies upon the random, but statistically evenly distributed, properties of the bit errors in the received signal to adjust the receiving process, i.e., adjust the gain of the receiver's signal amplifier. In this manner, the receiver selects the optimal analog signal with respect to bit error rates, instead of using an absolute or predetermined signal level, which merely assumes an optimal receiving state.

DETAILED DESCRIPTION OF THE PREFERRED EMBODIMENTS

Figure 1:
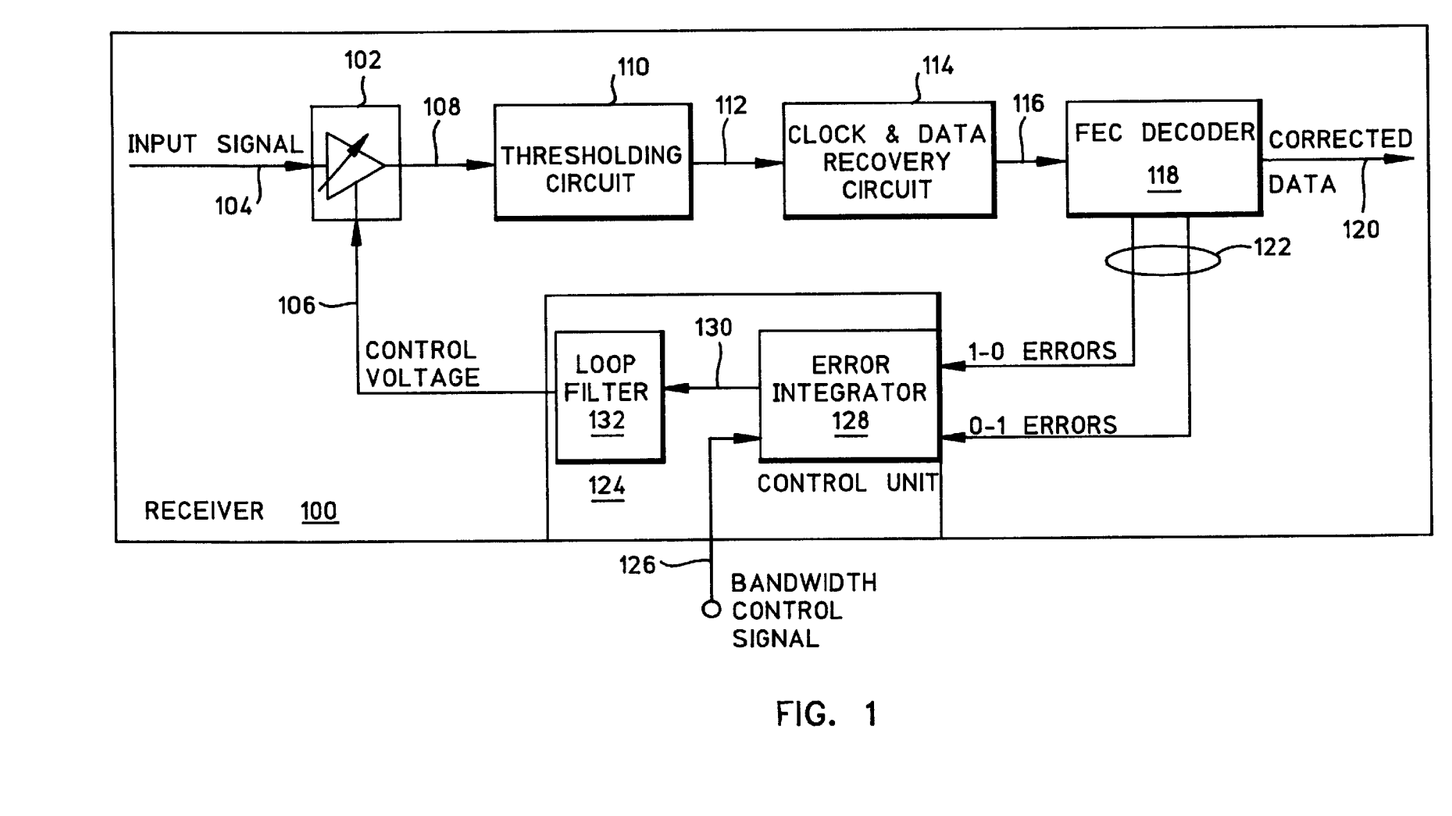
FIG. 1 is a schematic block diagram illustrating a system for optimizing the reception of digital communications, as described by the present invention.

FIG. 1 is a schematic block diagram illustrating a system for optimizing the reception of digital communications, as described by the present invention. The system 100 comprises a processor 102 having a first input on line 104, to accept a digital communication signal including forward error correction (FEC) sections. A second input on line 106 accepts processor control signals, or a control voltage. The processor 102 supplies a modified communication signal at an output on line 108 in response to the control signals on line 106.

Specifically, FIG. 1 illustrates the processor 102 as an amplifier. However, it is well known to control, optimize, or modify a received signal in an analog receiver with an automatic gain control (AGC) system that includes amplifiers, attenuators, dc bias, and bandwidth adjusting circuitry. As an amplifier, the processor 102 would have a gain responsive to the control signal on line 106. Control of an attenuator would affect the sensitivity of the received signal (the signal to noise ratio), while control of the bandwidth circuitry would control the system attack time. Control of dc bias could affect signal compressions, or the threshold value decision point. In addition, the processor could also be enabled as a signal filter that has a bandwidth responsive to the control signal on line 106. In short there are a number of well-known receiver parameters that can be modified with a control signal in a feedback network to improve the receipt of a communication.

A thresholding circuit 110 has an input connected to the processor output on line 108. At the input, the modified communication signal has characteristics of both an analog and a digital signal. The thresholding circuit 110 converts the modified communication signal into a digital signal of "1" bits and "0" bits at an output on line 112.

Figure 2:
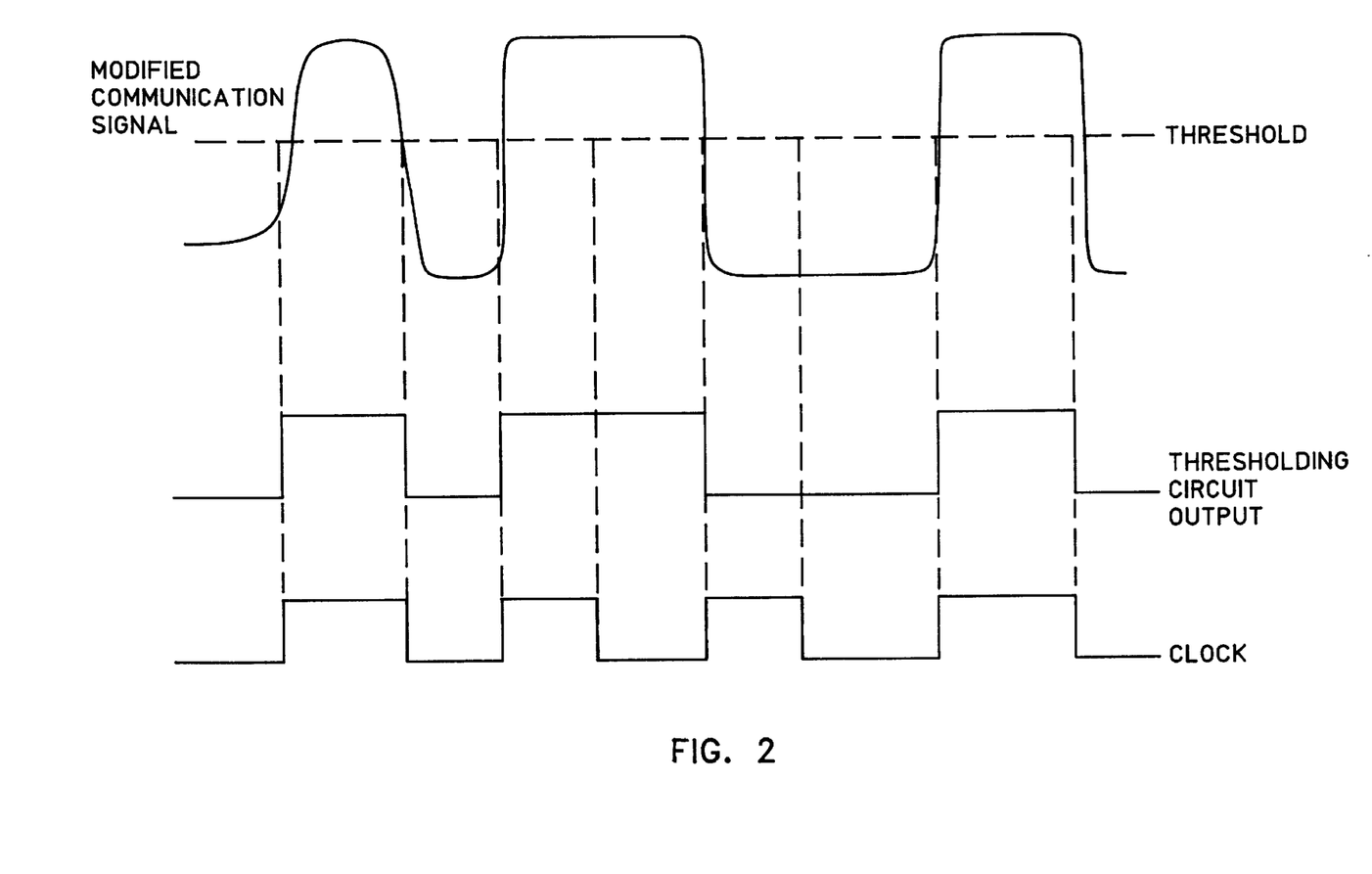
FIG. 2 is a diagram illustrating some properties of the modified communication signal and the digital output of the thresholding circuit.

FIG. 2 is a diagram illustrating some properties of the modified communication signal and the digital output of the thresholding circuit 110. The modified communication signal is compared to a threshold. If the voltage level exceeds the threshold, the signal is interpreted as a "1" bit, and if the communication signal voltage is less than the threshold level, the signal is interpreted as a "0" bit. The results of the interpretation process, the received digital signal, is displayed as the thresholding circuit output. In some aspects of the invention, not shown, the processor is not adjustable, but rather, the thresholding circuit adjusts the threshold level in response to the control signal.

The clock and data recovery circuit 114 receives the received digital signal on line 112 and generates a clock signal. The "1" bits and "0" bits can only be interpreted with respect to a time reference. In some. aspects of the invention, the clock signal is generated from the data. Otherwise, extrinsic information is used to provide the clock signal. The synchronized received digital signal is supplied on line 116. Alternately, the received digital signal and clock signals are supplied on line 116.

A. forward error correction (FEC) decoder 118 has an input connected to the thresholding circuit output on line 116. The decoder uses the forward error correction sections of the received digital signal for corrections. The FEC decoder 118 supplies a corrected digital signal on an output on line 120 and a decoder error signal at an output on line 122. The number of errors over a statistically relevant sample of bits are evenly distributed given a random noise environment. Using an amplifier as an example of the processor 102, if the errors are overly weighted towards "0" bit errors, the signal strength at the threshold detector is too low. If the errors are overly weighted towards "1" bit errors, then the signal strength is too high and the gain should be reduced.

Figure 3:
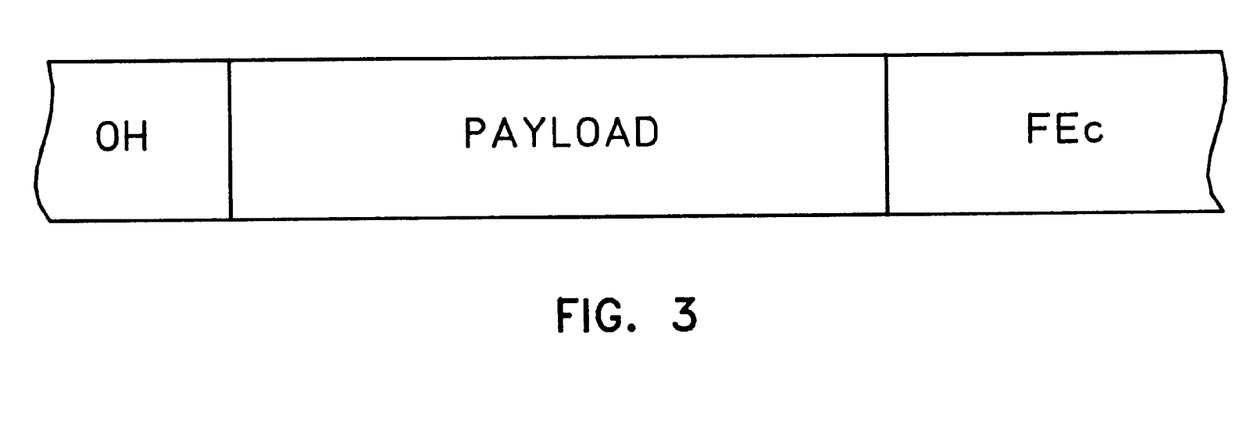
FIG. 3 is a diagram illustrating the structure of the digital signal.

FIG. 3 is a diagram illustrating the structure of the digital signal. The framing structure organizes the signal as a digital wrapper with overhead (OH), payload, and FEC sections. The FEC section. contains encoded information that permits the payload to be recovered, in the event that the signal becomes degraded. One FEC scheme is the well-known Reed-Solomon (RS) error correction format. The payload data is supplied on line 120, after corrections are made. An analysis of the corrections performed is supplied in line 122 More specifically, line 122 is shown as two lines that supply a tally of the number of "1" bits errors and of the number of "0" bit errors.

A control unit 124 has a first input connected to the FEC decoder output on line 122. The control unit 124 has an output connected to the second input of the processor 102 on line 106 to supply control signals that are responsive to the decoder error signals. The control unit. 124 accepts the decoder error signal on line 122 and compares the number of "1" bits corrected to the number of "0" bits corrected. The control unit 124 modifies the control signal on line 106 in response to the comparison of "1" bit and "0" bit corrections.

As shown in FIG. 2, the processor output on line 108 supplies a modified communication signal having a high polarity (arbitrarily) associated with "1" bits, and a low polarity associated with "0" bits. The control unit 124 modifies the control signal 106 to vary the swing between the high and low polarities of the modified communication signal output by the processor 102.

Figure 4:
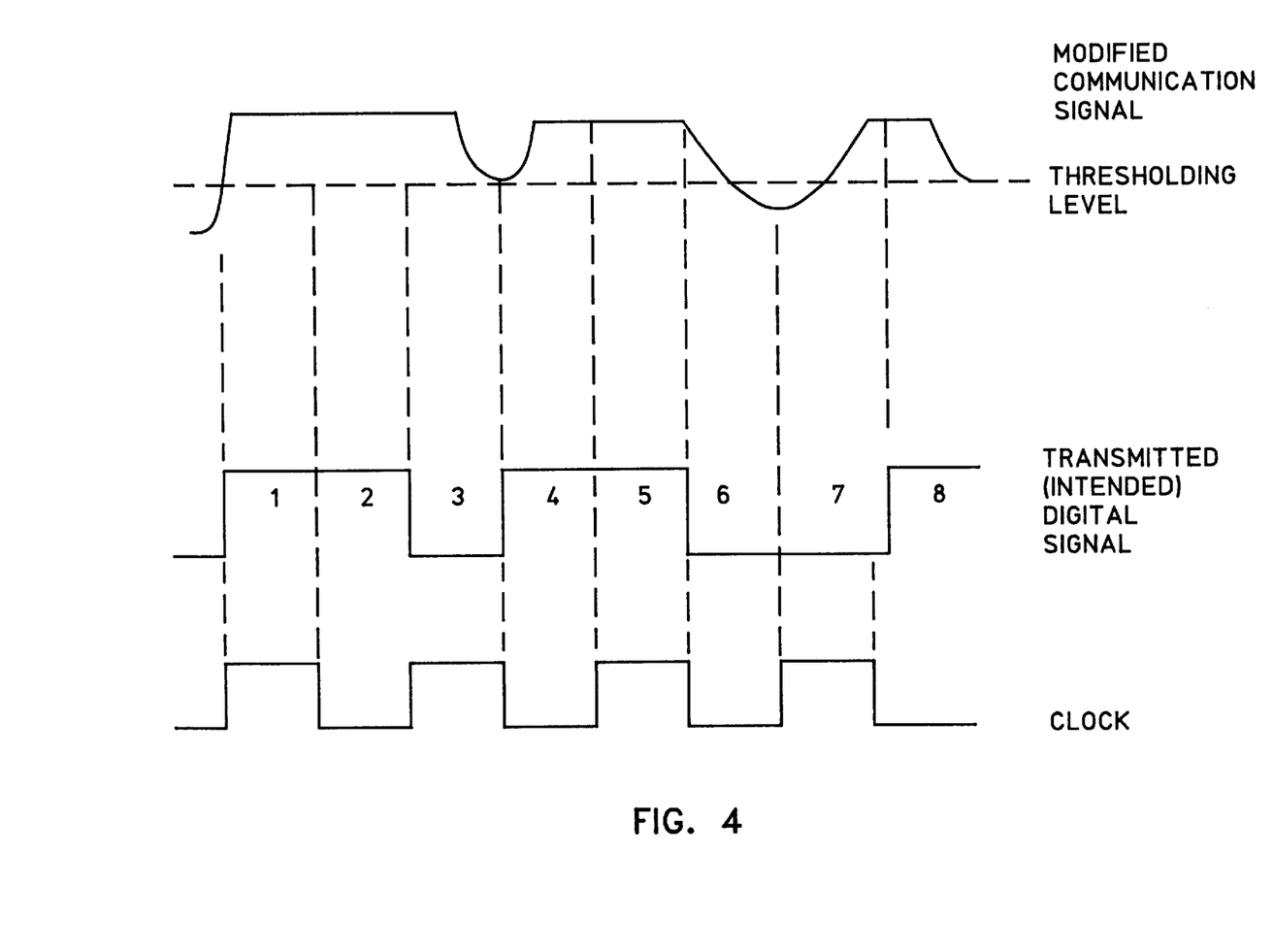
FIG. 4 is a diagram illustrating an improperly processed communication signal.

FIG. 4 is a diagram illustrating an improperly processed communication signal. The communication signal is compared to the transmitted, or intended digital signal. As can be seen, the communication signal is biased to the high polarity. The compression in the communication signal can result in a low slewing rate, and as a result, some of the "0" bit signal can be misinterpreted as "1" bit signals. As shown, bit 3 will be interpreted as a "1" bit, as the communication signal never reaches the threshold level. In this circumstance, the provision of "0" bit errors to the control unit can be used to indicate a misalignment in the processor 102. The present invention makes use of this kind of error correction data to improve the performance of the processor 102.

Returning to FIG. 1, when the FEC decoder output on line 122 supplies a decoder error signal indicating that a greater number of "1" bits are being corrected, the control unit 124 modifies the control signal in response to the FEC decoder signal, and the processor 102 supplies a modified communication signal on line 108 with a swing biased towards the high polarity (still using the arbitrary assumption that the high polarity is associated with "1" bits). When the FEC decoder output on line 122 supplies a decoder error signal indicating that a greater number of "0" bits are being corrected, the control unit 124 modifies the control signal in response to the decoder signal, and the processor 102 supplies a modified communication signal with a swig biased towards the low polarity.

The control unit 124 supplies a control signal that is responsive to the degree of the error. That is, the control unit 124 supplies a control signal that is responsive to the degree of difference between the number of "0" bit corrections and the number of "1" bit corrections received in the FEC decoder error signal on line 122. For example, if the control signal is a voltage control signal, the voltage level of the control signal will vary with the degree of the error. The control unit 124 supplies a control signal of high and low pulses having a duty cycle. The control signal varies in response to the duty cycle varying. Changes of degree in the control signal, voltage changes for example, are obtained by processing the pulsed control signal with a low pass loop filter, to obtain a slowly varying dc voltage.

The control unit supplies a control signal with an adjustable response time. That is, the rate at which the control unit 124 responds to the error signal in line 122 can be made to vary. The control unit 124 has a second input to accept a bandwidth signal on line 126. The control unit 124 supplies an integrated control signal that is responsive to the bandwidth control signal on line 126, as well as to the FEC, decoder error signal on line 122. The processor 102 modifies the communication signal in response to the integrated control signal on line 102. In short, an integrated control signal does not instantaneously respond to errors. In some aspects of the invention, instantaneous or bursty errors are known to occur that cannot be corrected by adjusting the processor 102. Integration prevents the system from responding to these short-term type errors. Alternately, an attempt to instantaneously modify the processor 102 can lead to an increase in the number of bits needed in the forward error correction of the payload.

The control unit 124 uses an error integrator 128 for integrating the control signal 102. The error integrator 128 has an output on line 130, and a loop filter 132 to supply a control signal that is responsive to the integrated error signal. The control unit 124 creates a count responsive to the number of "1" bit corrections, and offsets the count in response to the "0" bit corrections. The control unit integrates the count in response to the bandwidth signal to supply an integrated control signal 102. More specifically, the error integrator 128 integrates the control signal duty cycle, while the loop filter integrates the resulting analog signal on line 106.

The control unit 124 and, more specifically, error integrator 128 create a bit correction count that is responsive to the number of "1" bit corrections. This count is offset with the number of "0" bit corrections. This count is integrated in response to the bandwidth signal to supply a control signal responsive to the integrated count, as explained below.

Figure 5:
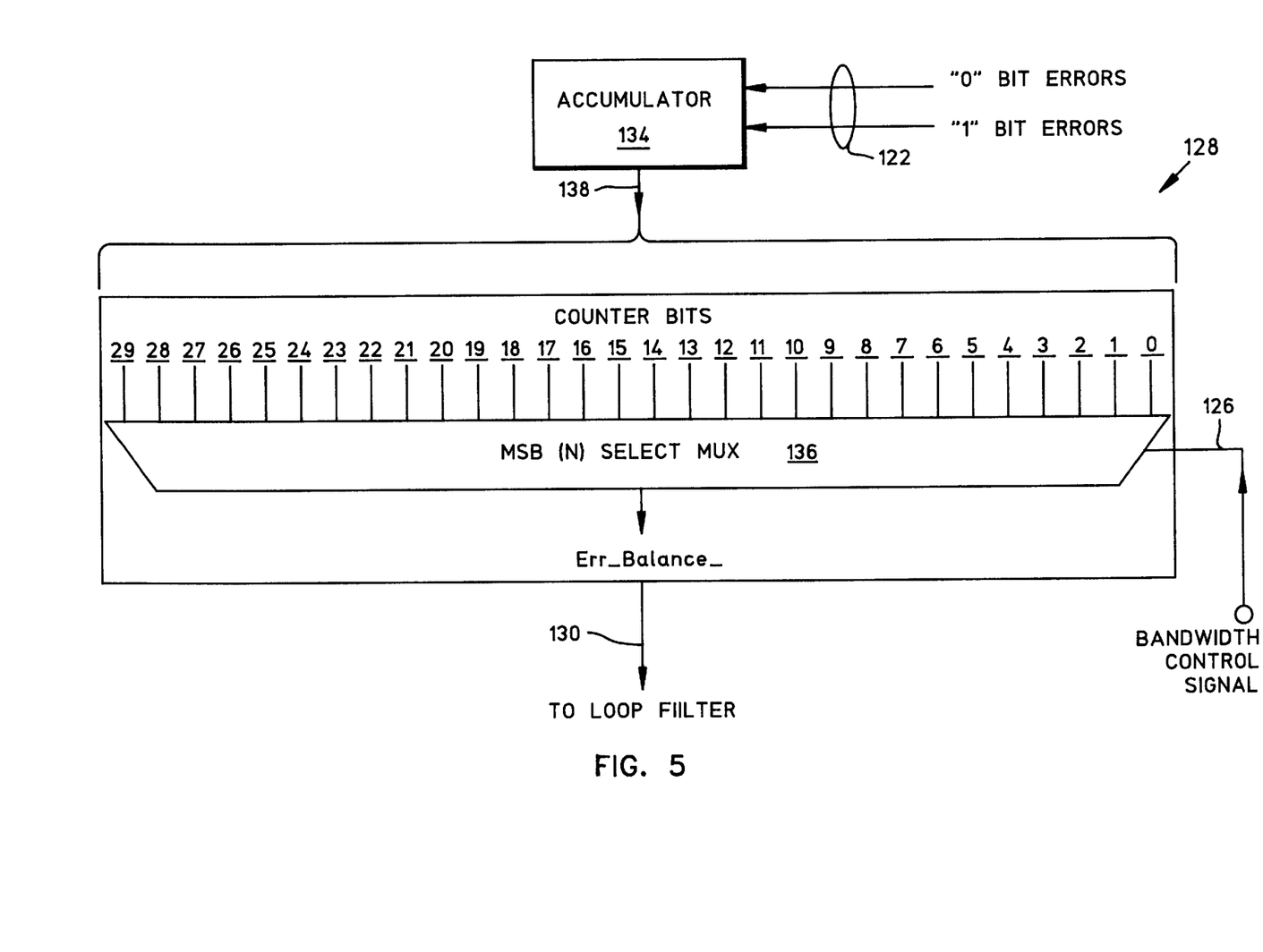
FIG. 5 is a schematic block diagram illustrating the error integrator of the present invention.

FIG. 5 is a schematic block diagram illustrating the error integrator 128 of the present invention. An accumulator 134 has an input connected to the FEC decoder error signal on line 122. The accumulator represents the bit correction count to a first plurality of places. In the example of FIG. 5, the accumulator 134 is a binary up/down countermand place corresponds to a base 2 bit place. Thus, the places, expressed as decimal numbers, are 0, 2, 4, 8, 16 . . . The invention could also be enabled using a binary to decimal counter or parallel operating counters for the "1" and "0" errors. Further, the invention is not limited to counting in any particular number base, and can be enabled using a plurality of systems which differentiate a count into a series of graduated steps. The count integration is responsive to the bandwidth signal which selects the highest order place of interest. The control signal is then derived from the selected highest order place count.

A multiplexor (MUX) 136 has a first input connected to the accumulator output on line 138, a second input to select a count place on line 126, and an output on line 130 that is responsive to the selected count place. The signal on line 130 is further integrated by the loop filter 132 to supply the control signal on line 106.

In the example of FIG. 5, accumulator 134 is supplying 30 places. Since the count is base 2, the places are bit places. The control unit 124 initializes the count by inserting a "1" bit in a selected bit place. Thus the error integrator 128 has a width (N), programmable by the user to be up to 30-bits wide. The bit selection adjusts the loop's response time (bandwidth). The count on line 130 will never go below zero or exceed the selected bit. After a reset, the count on line 130 starts off with the selected bit place being set to "1" and all other bits set to zero. The most significant bit (the selected bit) is output on the ERR_BAL pin which is sent to the loop filter 132 on line 130. Thus, the most significant bit (MSB) is selectable in response to the signal on line 128. The width of the error integrator 128 can be used to set the systems loop bandwidth (or sensitivity) so as to compensate for many different possible line conditions.

Figure 6:
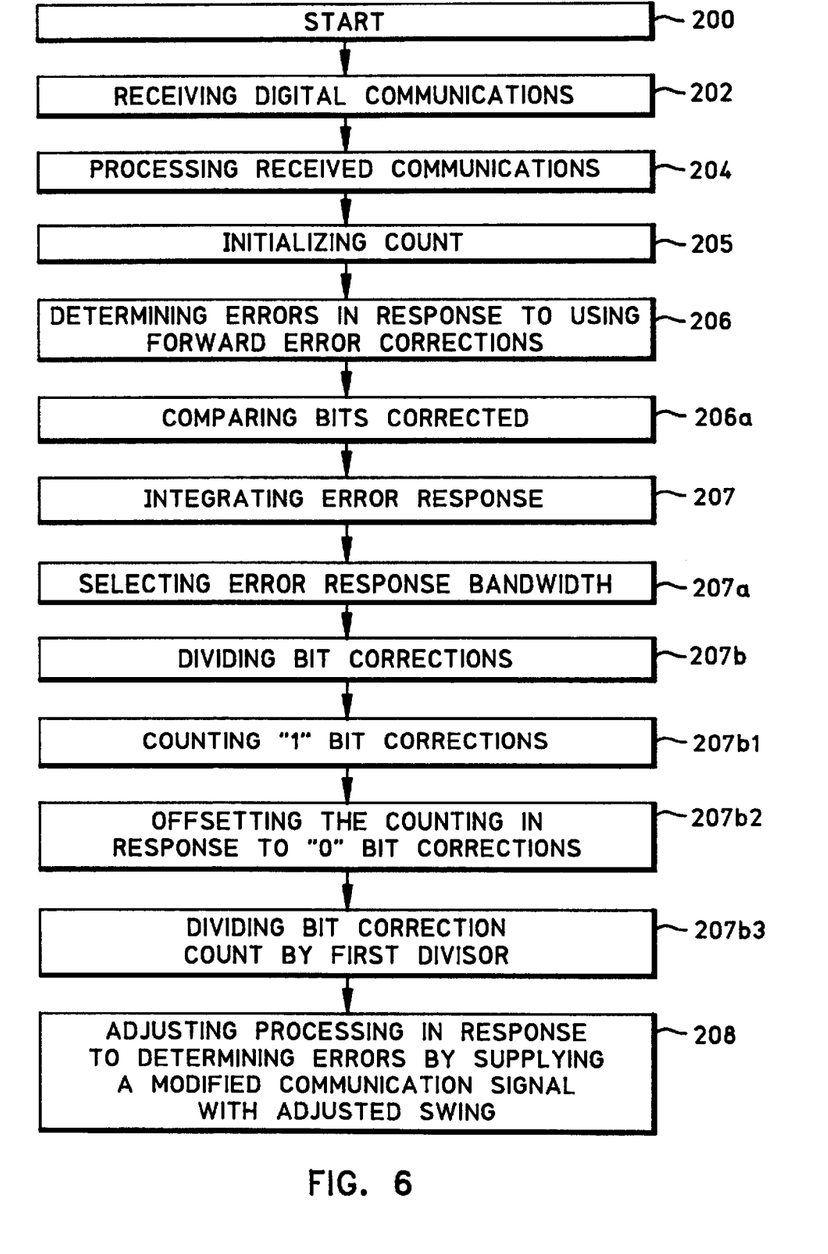
FIG. 6 is a flowchart depicting a method for optimizing the reception of digital communications.

FIG. 6 is a flowchart depicting a method for optimizing the reception of digital communications. Although the method is depicted as a sequence of numbered steps for clarity, no order should be inferred from the numbering unless explicitly stated. The method begins with Step 200. Step 202 receives digital communications including FEC sections. Step 204 processes the received communications. Step 206 determines errors in response to making forward error corrections. Step 208 adjusts the processing in response to determining errors.

In some aspects of the invention, adjusting the processing in Step 208 includes a function selected from the group including adjusting gain, adjusting sensitivity, adjusting the processor loop bandwidth adjustments, adjusting threshold, adjusting dc bias, and communication signal filtering adjustments.

In some aspects, determining errors in response to making forward error corrections in Step 206 includes sub-steps. Step 206a compares the number of "1" bits corrected to the number of "0" bits corrected. Adjusting the processing in response to determining errors in Step 208 includes adjusting the processing in response to the comparison of "1" bit and "0" bit corrections.

In some aspects of the invention, receiving digital communications including FEC sections in Step 202 includes receiving a signal having a high polarity associated with "1" bits, and a low polarity associated with "0" bits. Alternatively; the high polarity could be associated with "0" bits and the low polarity with "1" bits. Adjusting the processing in response to determining errors in Step 208 includes. supplying a modified communication signal with a signal swing adjusted between the high and low polarities.

In some aspects, adjusting the processing in response to determining errors in Step 208 includes biasing the signal swing towards the high polarity when a greater number of "1" bits are corrected. Adjusting the processing in response to determining errors in Step 208 includes biasing the signal swing towards the low polarity when a greater number of "0" bit errors are detected.

In some aspects of the invention, adjusting the processing in response to determining errors in Step 208 includes adjusting the signal swing bias in response to the degree of difference between the number of "0" bit corrections and the number of "1" bit corrections.

In some aspects of the invention, following the determining of errors in Step 206, Step 207 integrates the error response. Adjusting the processing in response to determining errors in Step 208 includes adjusting the processing in response to the integrated error response.

In some aspects, integrating the error response in Step 207 includes sub-steps. Step 207a selects the error response bandwidth. Step 207b divides the number of bit corrections with a divisor responsive to the selected error response bandwidth.

In some aspects of the invention, selecting the error response bandwidth in Step 207a includes selecting a first divisor from a set of proportionally graduated divisors. Then, dividing the number of bit corrections with a divisor responsive to the selected error response bandwidth in Step 207b includes sub-steps. Step 207b1 counts "1" bit corrections. Step 207b2 offsets the "1" bit corrections count with "0" bit corrections. Step 207b3 divides the bit correction count by the first divisor to supply a quotient. Adjusting the processing in response to the integrated error response in Step 208 includes adjusting the processing in response to the quotient. In some aspects of the invention, prior to counting bit corrections in Steps 207b1 and 207b2, Step 205 initializes the quotient with a number equal to the first divisor.

A system, and method have been provided to minimize the number of FEC corrections in received digital communications, by making receiver front end processes responsive to the kind of FEC errors that are corrected. A specific example using an amplifier and a counter/ntegrator control unit have been provided. However, the invention is also applicable to any receiver process that is modified and improved in response to an analysis of the FEC errors. In other aspects of the invention, not discussed, transmission parameters could be modified in response to the FEC correction made at the receiver. Other variations and embodiments of the invention will occur to those skilled in the art.

We claim:

1. A method for optimizing the reception of digital communications, the method comprising:

receiving digital communication including forward error correction (FEC) sections;

processing the received communications;

determining errors in response to making forward error corrections; and adjusting the processing in response to determining errors;

wherein determining errors in response to making forward error corrections includes:

comparing the number of "1" bits corrected to the number of "0" bits corrected;

wherein adjusting the processing in response to determining errors includes adjusting the processing in response to the comparison of "1" bit and "0" bit corrections;

wherein receiving digital communications including forward error correction (FEC) sections includes receiving a signal having a first polarity associated with "1" bits, and a second polarity associated with "0" bits; and wherein adjusting the processing in response to determining errors includes supplying a modified communication signal with a signal swing adjusted between the first and second polarities.

2. The method of claim 1 wherein adjusting the processing in response to determining errors includes biasing the signal swing towards the first polarity when a greater number of "1" bits are corrected; and wherein adjusting the processing in response to determining errors includes biasing the signal swing towards the second polarity when a greater number of "0" bit errors are detected.

3. The method of claim 2 wherein adjusting the processing in response to determining errors includes adjusting the signal swing bias in response to the degree of difference between the number of "0" bit corrections and the number of "1" bit corrections.

4. The method of claim 3 further comprising:

following the determining of errors in response to making forward error corrections, integrating the error response; and wherein adjusting the processing includes adjusting the processing in response to the integrated error response.

5. The method of claim 4 wherein integrating the error response includes:

selecting the error response bandwidth; and dividing the number of bit corrections with a divisor responsive to the selected error response bandwidth.

6. The method of claim 5 wherein selecting the error response bandwidth includes selecting a first divisor from a set of proportionally graduated divisors;

wherein dividing the number of bit corrections with a divisor responsive to the selected error response bandwidth includes:

counting "1" bit corrections;

offsetting the "1" bit corrections count with "0" bit corrections;

dividing the bit correction count by the first divisor to supply a quotient; and wherein adjusting the processing in response to the integrated error response includes adjusting the processing in response to the quotient.

7. The method of claim 6 further comprising:

prior to counting bit corrections, initializing the quotient with a number equal to the first divisor.

8. A system for optimizing the reception of digital communications, the system comprising:

a processor having a first input to accept a communication signal including forward error correction (FEC) sections, and a second input to accept control signals, the processor supplying a modified communication signal at an output in response to the control signals;

a thresholding circuit having an input connected to the processor output, the thresholding circuit converting the modified communication signal to supply "1" bits and "0" bits at an output, a forward error correction (FEC) decoder having an input connected to the thresholding circuit output, the FEC decoder using the forward error correction sections of the modified communication signal for corrections, and supplying a FEC decoder error signal at an output; and a control unit having a first input connected to the FEC decoder output, the control unit having an output connected to the second input of the processor to supply control signals that are responsive to the FEC decoder error signals;

wherein the control unit accepts the FEC decoder error signal and compares the number of "1" bits corrected to the number of "0" bits corrected, the control unit modifying the control signal in response to the comparison of "1" bit and "0" bit corrections.

9. The system of claim 8 wherein the processor output supplies the modified communication signal having a first polarity associated with "1" bits, and a second polarity associated with "0" bits; and wherein the control unit modifies the control signal to vary the swing between the first and second polarities of the modified communication signal output by the processor.

10. The system of claim 9 wherein the FEC decoder output supplies a FEC decoder error signal indicating that a greater number of "1" bits are being corrected;

wherein the control unit modifies the control signal in response to the FEC decoder error signal; and wherein the processor supplies a modified communication signal with a signal swing biased towards the first polarity.

11. The system of claim 9 wherein the FEC decoder output supplies a FEC decoder error signal indicating that a greater number of "0" bits are being corrected;

wherein the control unit modifies the control signal in response to the FEC decoder error signal; and wherein the processor supplies a modified communication signal with a signal swing biased towards the second polarity.

12. The system of claim 9 wherein control unit supplies a control signal that is responsive to the degree of difference between the number of "0" bit corrections and the number of "1" bit corrections received in the decoder error signal.

13. The system of claim 12 wherein the control unit includes a second input to accept a bandwidth signal, the control unit supplying an integrated control signal responsive to the FEC decoder error signal and the bandwidth signal; and wherein the processor modifies the communication signal in response to the integrated control signal.

14. The system of claim 13 wherein the control unit creates a count responsive to the number of "1" bit corrections, and offsets the count in response to the "0" bit corrections, the control unit supplying a count that is integrated in response to the bandwidth signal.

15. The system of claim 14 wherein the control unit represents the bit corrections in a count having a first plurality of places, the control unit selecting highest order place of interest in response to the bandwidth signal and supplying a control signal responsive the highest order count place.

16. The system of claim 15 wherein the control unit includes:

an accumulator having an input to accept the FEC decoder error signal, the accumulator counting the number of "1" bit corrections offset by the number of "0" bit corrections, and supplying the count to a first plurality places; and a multiplexor (MUX) having a first input connected to the accumulator output, a second input to select an accumulator count place, and a control signal output that is responsive to the selected count place.

* * * * *